(12) United States Patent
Zinner et al.

(10) Patent No.: US 12,199,062 B2
(45) Date of Patent: Jan. 14, 2025

(54) DEVICE AND METHOD FOR THE ALIGNMENT OF SUBSTRATES

(71) Applicant: EV Group E. Thallner GmbH, St. Florian am Inn (AT)

(72) Inventors: Dominik Zinner, St. Florian am Inn (AT); Friedrich Paul Lindner, St. Florian am Inn (AT); Thomas Plach, St. Florian am Inn (AT); Peter Starzengruber, St. Florian am Inn (AT)

(73) Assignee: EV Group E. Thallner GmbH, St. Florian am Inn (AT)

(*) Notice: Subject to any disclaimer, the term of this patent is extended or adjusted under 35 U.S.C. 154(b) by 207 days.

(21) Appl. No.: 17/926,737

(22) PCT Filed: Jun. 30, 2020

(86) PCT No.: PCT/EP2020/068407
§ 371 (c)(1),
(2) Date: Nov. 21, 2022

(87) PCT Pub. No.: WO2022/002372
PCT Pub. Date: Jan. 6, 2022

(65) Prior Publication Data
US 2023/0207513 A1 Jun. 29, 2023

(51) Int. Cl.
*H01L 23/00* (2006.01)

(52) U.S. Cl.
CPC ............. *H01L 24/80* (2013.01); *H01L 24/74* (2013.01); *H01L 2224/74* (2013.01); *H01L 2224/8013* (2013.01); *H01L 2224/8016* (2013.01); *H01L 2224/80894* (2013.01); *H01L 2224/80908* (2013.01); *H01L 2224/80986* (2013.01); *H01L 2924/40* (2013.01)

(58) Field of Classification Search
CPC ................. H01L 24/80; H01L 2224/74; H01L 2224/8016; H01L 2224/80908; H01L 2924/40; H01L 21/67288; H01L 21/67259
See application file for complete search history.

(56) References Cited

U.S. PATENT DOCUMENTS

| | | |
|---|---|---|
| 8,454,771 B2 | 6/2013 | Horikoshi |
| 8,614,797 B2 | 12/2013 | Hellwig et al. |
| 9,194,700 B2 | 11/2015 | Kast et al. |
| 9,576,825 B2 | 2/2017 | Figura |
| 10,388,545 B2 | 8/2019 | Figura |
| 10,943,807 B2* | 3/2021 | Wagenleitner ........ H01L 23/544 |
| 11,282,706 B2 | 3/2022 | Wagenleitner et al. |

(Continued)

FOREIGN PATENT DOCUMENTS

| | | |
|---|---|---|
| DE | 10 2005 029 368 A1 | 12/2006 |
| DE | 10 2012 210 823 A1 | 12/2012 |

(Continued)

OTHER PUBLICATIONS

Office Action issued in related Japanese Patent Application No. 2022-573583 dated Jun. 25, 2024 along with the English-language translation.

(Continued)

*Primary Examiner* — Hung V Nguyen
(74) *Attorney, Agent, or Firm* — KUSNER & JAFFE

(57) ABSTRACT

The invention relates to a device and a method for the alignment of substrates.

20 Claims, 5 Drawing Sheets

(56) References Cited

U.S. PATENT DOCUMENTS

| | | |
|---|---|---|
| 11,361,980 B2 | 6/2022 | Figura |
| 11,756,921 B2 * | 9/2023 | Chang .................. H01L 23/544 |
| | | 438/16 |
| 12,025,426 B2 * | 7/2024 | Zinner .................... H01L 22/12 |
| 12,051,601 B2 * | 7/2024 | Kim ........................ H01L 24/03 |
| 2009/0101037 A1 | 4/2009 | Suehira et al. |
| 2009/0305176 A1 | 12/2009 | Hattori |
| 2010/0139836 A1 | 6/2010 | Horikoshi |
| 2012/0237328 A1 | 9/2012 | Figura |
| 2012/0327428 A1 | 12/2012 | Hellwig et al. |
| 2013/0162997 A1 | 6/2013 | Kast et al. |
| 2016/0322249 A1 | 11/2016 | Figura |
| 2019/0019678 A1 | 1/2019 | Wagenleitner et al. |
| 2019/0244816 A1 | 8/2019 | Wagenleitner et al. |
| 2019/0326137 A1 | 10/2019 | Figura |
| 2020/0055729 A1 | 2/2020 | Wagenleitner et al. |
| 2022/0102146 A1 | 3/2022 | Wagenleitner et al. |
| 2022/0270896 A1 | 8/2022 | Figura |

FOREIGN PATENT DOCUMENTS

| | | |
|---|---|---|
| EP | 2 299 472 A1 | 3/2011 |
| JP | 2013-505592 A | 2/2013 |
| WO | WO-02/10721 A2 | 2/2002 |
| WO | WO-2009/022457 A1 | 2/2009 |
| WO | WO-2012/028166 A1 | 3/2012 |
| WO | WO-2017/162272 A1 | 9/2017 |

OTHER PUBLICATIONS

International Search Report from corresponding International Patent Application No. PCT/EP2020/068407, dated Apr. 22, 2021 with English-language translation.

Written Opinion from corresponding International Patent Application No. PCT/EP2020/068407, dated Apr. 22, 2021.

* cited by examiner

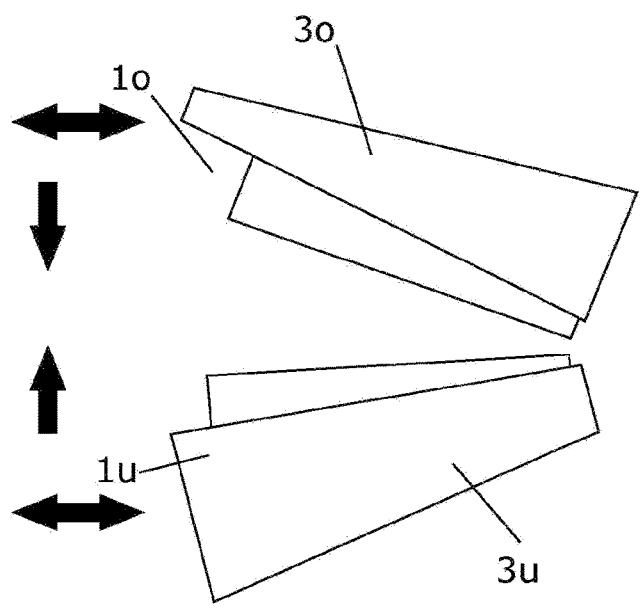
Fig. 4c
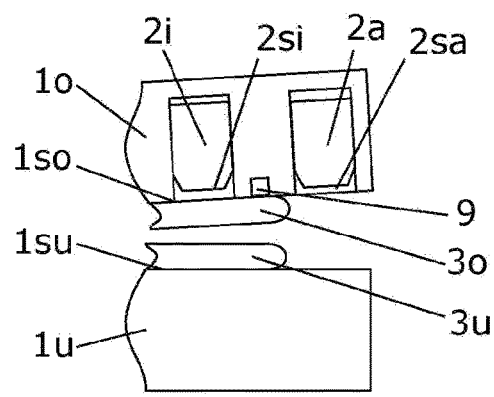
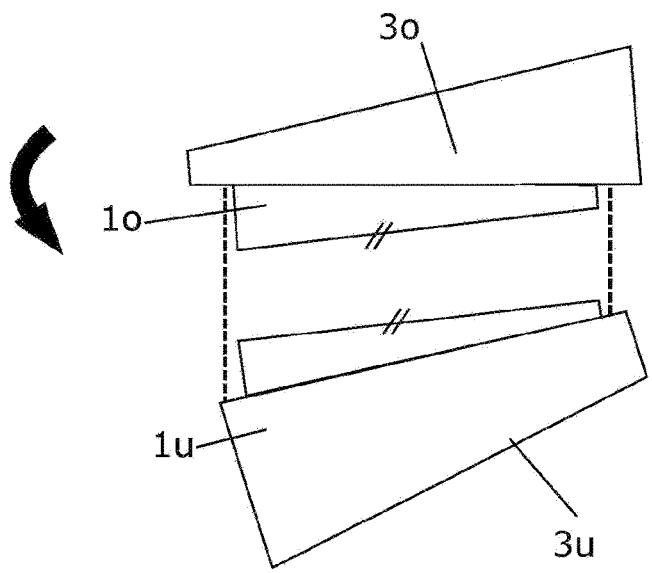
Fig. 4d
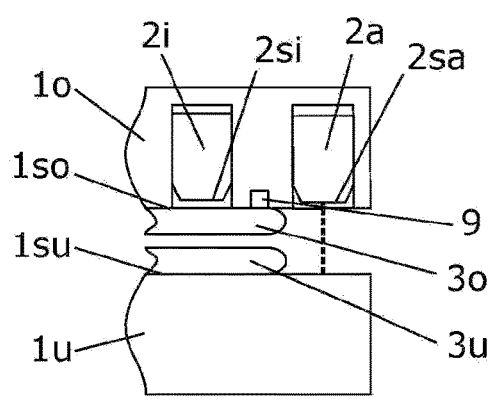

DEVICE AND METHOD FOR THE ALIGNMENT OF SUBSTRATES

FIELD OF THE INVENTION

The invention relates to a device and a method for the alignment of substrates.

BACKGROUND OF THE INVENTION

Many devices and methods for wedge error compensation are known in the prior art. A wedge error compensation is of decisive importance for example in lithography, in particular photolithography, since it must be ensured that the photomask is positioned parallel to the substrate surface to be exposed. Any inclined position between the photomask and the substrate leads to a distorted exposure of the photosensitive layer on the substrate. A wedge error compensation has also already been disclosed for the use of embossing lithography systems. WO2012028166A1 shows a device and a method, wherein an interferometer measures the distance between two substrate surfaces. The measurement takes place through one of the two transparent substrates. The substrates are nano-embossing stamps. The central idea behind WO2012028166A1 consists in compensating for the wedge error between the substrate surfaces on which the embossing structures are located. WO0210721A2, on the other hand, discloses the wedge error compensation via surfaces which are not part of the functional surface. This approach is not optimum, since it cannot be assumed that the surface at which the measurement takes place is parallel to the functional surface, in the present example the surface with the embossing structures. Publication US 20090101037A1 discloses a device and a method for measuring the distance between two surfaces. With the measurement at a single position, however, a wedge error cannot be compensated for.

The wedge error compensation between substrates to be bonded has become ever more important in recent years, so that an attempt has been made to adopt the concepts from lithography into bonding technology.

A major problem in the prior art consists in the fact that there are no devices or methods revealed, with the aid of which the wedge error compensation can be carried out with the required speed. The throughput is of decisive importance for economic success especially in the case of bonding. A further drawback consists in the fact that most substrates that are used for bonding are non-transparent for electromagnetic radiation used, in particular for visible light and infrared. It is true that silicon wafers are infrared-transparent, but the infrared transparency is ruined again by metallic coatings which are routinely deposited on silicon wafers.

SUMMARY OF THE INVENTION

It is therefore the aim of the present invention to show a device and a method for the alignment of substrates which at least partially eliminate, in particular completely eliminate the drawbacks listed in the prior art. In addition, an improved device and an improved method for the alignment of substrates, in particular by the compensation of a wedge error between the substrates, are to be shown. In particular, a device and a method are to be shown, with which a wedge error compensation can be carried out more quickly and more efficiently during the processing of substrates, in particular during the bonding. Furthermore, a device and a method are to be shown, with which non-transparent substrates, in particular for electromagnetic radiation, for visible light and for infrared, can be aligned.

The present problem is solved with the features of the independent claims. Advantageous developments of the invention are stated in the sub-claims. All combinations of at least two features stated in the description, the claims and/or the drawings also fall within the scope of the invention. In the case of stated value ranges, values also lying within the stated limits are also deemed to be disclosed as limiting values and can be claimed in any combination.

Accordingly, the invention relates to a device for the alignment of substrates, in particular of wafers, comprising:

a first substrate holder for accommodating a first substrate on a first substrate holder surface, a second substrate holder for accommodating a second substrate on a second substrate holder surface, wherein the first substrate holder surface is facing towards the second substrate holder surface, and wherein the first substrate holder comprises at least three inner distance sensors for measuring first distances to the first substrate, in particular to a substrate surface of the first substrate, characterised in that the first substrate holder comprises at least three outer distance sensors for measuring second distances to the second substrate holder surface of the second substrate holder.

Furthermore, the invention relates to a method for the alignment of substrates, in particular of wafers, in particular with the device for the alignment of substrates, with the following steps, in particular in the following sequence:

i) accommodating of a first substrate on a first substrate holder surface of a first substrate holder, ii) accommodating of a second substrate on a second substrate holder surface of a second substrate holder, wherein the first substrate holder surface is facing towards the second substrate holder surface, iii) measurement of first distances between at least three inner distance sensors of the first substrate holder and the first substrate, in particular to a substrate surface of the first substrate, iv) measurement of second distances between at least three outer distance sensors of the first substrate holder and the second substrate holder surface of the second substrate holder.

In an embodiment of the invention, provision is made such that in each case one of the at least three inner distance sensors and in each case one of the at least three outer distance sensors together form a distance sensor pair, wherein preferably the inner distance sensor and the outer distance sensor of a distance sensor pair, proceeding from a reference point, in particular from a centre point of the first substrate holder surface, are aligned in the radial direction.

The inner distance sensor of a distance sensor pair is arranged such that the latter can measure a first distance to a first substrate arranged on the first substrate holder surface. The associated outer distance sensor of the distance sensor pair is not covered by the first substrate and can measure a second distance to the opposite substrate holder surface of the second substrate holder, wherein preferably the outer distance sensor is aligned in the radial direction with the inner distance sensor of the distance sensor pair. The outer distance sensor thus measures the substrate holder surface at a point which is preferably aligned in the radial direction with the point measured by the inner distance sensor. Apart from design advantages, the measurement accuracy in particular can thus be increased and/or a wedge error can be particularly well compensated in the alignment of further substrates.

In a very special embodiment according to the invention, the inner distance sensors are designed such that they can directly measure the wedge error between the substrates, in that they measure the distance between the two substrate surfaces facing one another. The measurement principle is preferably based on an interference measurement. In this case, the substrate that is fixed on the side of the distance sensors must be transparent for the corresponding electromagnetic radiation.

In a further embodiment of the invention, provision is made such that the first substrate holder comprises at least three distance sensor pairs, wherein the respective inner distance sensor and the respective outer distance sensor of the at least three distance sensor pairs are in each case preferably aligned in the radial direction. At least three, in particular all the distance sensor pairs thus preferably comprise distance sensors aligned in the radial direction. The measurement accuracy can thus advantageously be increased and/or a wedge error can be particularly well compensated during the alignment of further substrates.

In a further embodiment of the invention, provision is made such that the at least three outer distance sensors are arranged, in particular symmetrically offset, on a first circle about a reference point, in particular about a centre point, of the first substrate holder surface. The outer distance sensors are preferably arranged with respect to one another at an identical distance in the circumferential direction of the first circle. As a result of the, in particular symmetrically offset, arrangement of the outer distance sensors on the first circle, a wedge error at different points at the same distance from the reference point on the substrate holder surface lying opposite can advantageously be detected and the measurement accuracy in particular is increased.

In a further embodiment of the invention, provision is made such that the at least three inner distance sensors are arranged, in particular symmetrically offset, on a second circle about a reference point, in particular about a centre point, of the first substrate holder surface, wherein the first circle and the second circle are preferably concentric with respect to one another. The inner distance sensors are preferably arranged at an identical distance from one another in the circumferential direction of the second circle. As a result of the, in particular symmetrically offset, arrangement of the inner distance sensors on the second circle, a wedge error at different points at the same distance from the reference point on the first substrate can advantageously be detected and the measurement accuracy in particular is increased. As a result of the concentric arrangement, the first circle and the second circle have a common circle centre point, i.e. the reference point. This arrangement is advantageous in particular for the measurement accuracy of the wedge error between the substrates. Furthermore, an identical spatial reference system can advantageously be used in particular in a calculation of the wedge error compensation.

In a further embodiment of the invention, provision is made such that the at least three inner distance sensors and/or the at least three outer distance sensors are arranged beneath the first substrate holder surface. The construction cost in particular can thus be reduced and the device can advantageously be designed small. Apart from the space saving, sensor cables and further supply lines of the distance sensors can be arranged inside the substrate holder. Furthermore, the inner distance sensors can measure the distance to the first substrate as close as possible and with the least possible interference factors. In addition, with distance sensors flush-mounted into the first substrate holder, the substrate can advantageously be moved parallel to the first substrate holder surface without striking the distance sensors.

In a further embodiment of the invention, provision is made such that the first substrate holder surface and the second substrate holder surface can be arranged at least partially, preferably completely, above one another, so that the first substrate can be dropped onto the second substrate. The first substrate holder is thus preferably, and by way of example, an upper substrate holder and the second substrate holder is a lower substrate holder. During the transfer of the first substrate to the second substrate holder, in particular during the calibration, the first substrate can thus advantageously be dropped onto the second substrate due to gravity. In particular, only the release by fixing elements is required for this. In particular, no further means are thus required for the transfer.

In a further embodiment of the invention, provision is made such that the at least three inner distance sensors and/or the at least three outer distance sensors can be moved in the radial direction with respect to a reference point, in particular a centre point, of the first substrate holder surface. The distance sensor pairs can thus advantageously be adapted to substrates differing in size, in particular wafers with different diameters. A corresponding device can thus advantageously align substrates with variable sizes.

In a further embodiment of the invention, provision is made such that the at least three inner distance sensors can be moved along the second circle and/or the at least three outer distance sensors along the first circle. The distance sensors can thus advantageously be positioned for the respective process. For example, in additional process steps, other components could hinder or impair the measurement. The position can be duly adjusted by the mobility along the first circle and the second circle. Furthermore, an adjustment to different measurement points along the first and the second circle is possible, so that the measurement accuracy can be improved.

In a further embodiment of the invention, provision is made such that the at least three inner distance sensors and/or the at least three outer distance sensors can be moved perpendicular to the first substrate holder surface. The vertical position of the distance sensors can thus advantageously be adjusted. The distance sensors can for example be completely flush-mounted into the substrate holder and enable a direct abutment of the first substrate with the first substrate holder surface. Furthermore, the distance sensors for the maintenance can advantageously be adjusted. In particular, it is also advantageous that the focus of the distance sensors can advantageously be adjusted and the measurement range can thus be adapted in the optimum manner to the respective process and to the substrate used.

In a further embodiment according to the invention, provision is made such that the first substrate holder and/or the second substrate holder can be aligned with one another, in particular depending on the first distances and/or the second distances, so that a wedge error between the first substrate and the second substrate can be compensated. The substrate holders can in particular be moved arbitrarily by means of actuators. A wedge error between the first substrate and the second substrate measured by the distance sensors and calculated by an electronic data-processing device can thus be compensated. In particular, it is not necessary for both substrate holders to be able to be aligned. Consequently, only one of the substrate holders can be aligned. In particular, the first substrate holder and/or the second substrate holder can also be aligned in the horizontal and/or vertical direction with respect to the corresponding substrate holder surface. The substrates to be aligned can thus advantageously be brought closer to one another and the measurement accuracy in particular can be increased.

In a further embodiment of the invention, provision is made such that the first substrate holder and/or the second substrate holder comprises controllable fixing elements, so that the first substrate and/or the second substrate can be fixed and/or released. Especially during a calibration, the first substrate can be dropped onto the second substrate by releasing the substrate by means of the fixing elements, when the first substrate holder is arranged above the second substrate holder. Furthermore, by means of a fixing of the substrates, slipping of the substrates can be prevented. Furthermore, it can be ensured by means of the fixing elements that the respective substrates lie in a predefined position on the corresponding substrate holder surfaces during a measurement by means of the distance sensors. The measurement accuracy in particular can thus be increased.

In a further embodiment of the invention, provision can be made such that the method additionally comprises the following steps, in particular in the following sequence:
a) storage of the first distances of the at least three inner distance sensors measured in step iii), in particular in an electronic data-processing device,
b) transfer of the first substrate to the second substrate holder (1u), so that the first substrate hes on the second substrate,
c) measurement of further first distances between the at least three inner distance sensors and the first substrate, wherein the first substrate lies on the second substrate,
d) alignment of the first substrate holder and/or the second substrate holder, so that in each case a difference between the respective further measured first distances of the at least three inner distance sensors and the respective stored first distances of the at least three inner distance sensors is the same, as a result of which a wedge error between the first substrate and the first substrate holder is compensated,
e) storage of the second distances of the at least three outer distance sensors to the second substrate holder surface of the second substrate holder measured in step iv), in particular in the electronic data-processing device,
wherein the storage in step e) takes place after the alignment in step d).

The measured values of the at least three inner distance sensors are stored. The first substrate lies on the first substrate holder surface. Through this first measurement in particular, not only is the distance of the sensors to the substrate surface of the first substrate thus determined, but also the distance to the substrate holder surface of the first substrate. The device is thus calibrated to the substrate surface of the first substrate or to the substrate holder surface of the first substrate holder. The at least three inner distance sensors then again each measure a distance to the first substrate, wherein the substrate lies on the second substrate.

By comparing these two measured values of the correspondingly at least three inner distance sensors, a wedge error between the substrates can be determined and the alignment of the first and/or the second substrate holder can take place, in such a way that a wedge error between the substrates is no longer present. In particular, immediately after the wedge error has been compensated, the three outer distance sensors measure the distance to the second substrate holder surface. A method for the alignment, in particular for the alignment of a wedge error, of two substrates can thus advantageously be calibrated, so that the method does not have to be re-calibrated for further substrates to be aligned. An alignment can then advantageously take place by means of the outer distance sensors. The process speed is thus increased and a plurality of substrates can be efficiently aligned with one another.

In a further embodiment of the invention, provision is made such that the alignment of a further first substrate and a further second substrate with one another takes place depending on the second distances, in particular takes place depending on the second distances stored in step e), so that a wedge error between the further first substrate and the further second substrate is compensated. A plurality of substrates of the same kind can thus advantageously be aligned or processed, in particular bonded, after one another. The process speed can thus be markedly increased and the alignment process, in particular for the compensation of a wedge error, can be improved.

The invention is based on the idea of positioning at least two distance sensors in each case at at least three positions of a first substrate holder, in such a way that at least one of the two distance sensors measures the rear side of a substrate on the first substrate holder and the respective second distance sensor measures the distance to the substrate holder surface of a second substrate holder. As a result of using two distance sensors per position, the wedge error compensation for further substrate pairs, which have to be compensated with respect to one another, can be carried out more efficiently, in particular more quickly.

The essence of the invention includes a device and a method, with the aid of which it is possible to carry out a wedge error between two substrates, in particular to wafers, more efficiently. In particular, the wedge error between non-transparent substrates can also be carried out efficiently with the invention. The invention is based in particular on the use of at least six sensors, whereof two are united into a respective pair in each case, distributed over at least three positions of a substrate holder.

The advantage of the invention includes that, by means of a calibration process, the wedge error between the substrates and at the same time between the substrate holder surfaces is measured and in further process steps the wedge error between the substrates can be compensated, in that the distances to a substrate holder surface measured in the calibration process are reset.

A measurement of the, in particular non-transparent, substrates and the wedge error between the substrate surfaces is thus no longer necessary, but is replaced by a distance measurement displaced outwards. A wedge error between non-transparent substrates can thus also be compensated. A further essential advantage thus includes that the wedge error between non-transparent substrates can be compensated.

It is preferable that the substrates to be used all have the same change in thickness as a function of the location, which in the ideal case should of course be zero. The substrates do not therefore have to be of equal thickness, but they should have surfaces which are as plane-parallel as possible. If the substrates do not have plane-parallel surfaces, then they should at least all have the same shape and the same orientation with respect to the equipment according to the invention.

The invention describes a device and a method for eliminating the wedge error between two substrates. A substrate is understood to mean any kind of object which can be fixed on a substrate holder. In particular, a substrate is a wafer or a stamp for an embossing process.

Stamps have already been designated as substrates in WO2012028166A1. This general formulation is also pursued in this document. In the following text, a substrate is primarily understood to mean a wafer, since the corresponding drawings can be made simpler and clearer.

The device and the method are preferably used for wedge error compensation during bonding.

Substrate Holder

The substrate holder has at least three positions. At least two sensors are located at each position. The sensors are distance sensors. In each case, at least one inner and at least one outer distance sensor at the same position are also referred to in the text as a distance sensor pair. The distance sensors are preferably interferometers. The distance sensors are positioned per position in such a way that one of the two distance sensors can measure the rear side of a fixed substrate, while the second distance sensor measures beyond the substrate.

The distance sensor which measures the rear side of the fixed substrate is referred to as the first or inner distance sensor. The distance sensor which measures beyond the substrate is referred to as the second or outer distance sensor. The second distance sensor thus measures the substrate surface of the second substrate holder lying opposite the first substrate holder.

It is clear to the person skilled in the art that the inventive idea could be further improved, in that a plurality of inner distance sensors and/or a plurality of outer distance sensors per position are used. For the sake of simplicity, however, only one inner and one outer distance sensor per position will be described in the subsequent text.

The distance sensor pairs are preferably positioned symmetrically along the circle with the same angle. If three distance sensor pairs are used, the angle between the distance sensor pairs preferably amounts to a constant 120°. It is however also conceivable that they are not positioned at the same angle. This is especially the case when it is no longer feasible for design-related reasons.

It is also conceivable that the distance sensors are designed mobile. In an embodiment, they can be moved along a circle with a constant radius. In a preferred embodiment, a radial movement, in particular in addition to the degree of freedom of movement along a circle, would also be conceivable. Generally, therefore, a movement of the distance sensors at least along two directions is conceivable. The distance sensor pairs could then be adjusted to different substrate diameters and only one corresponding substrate holder according to the invention would have to be designed.

An essential aspect consists in the fact that the exact positioning and fixing of the distance sensors inside the substrate holder in the z-direction, i.e. in the thickness direction, is in particular irrelevant. This is due to the fact that the inner distance sensors establish with a fixed substrate a zero point, in relation to which the distance to the rear side of the same substrate in another position is then measured in further process steps. This feature will be dealt with at greater length in the description of the method. Nonetheless, a mobile embodiment of the distance sensors in the z-direction is conceivable and can be implemented. As a result of a mobility in the z-direction, the measurement ranges in particular can be adjusted in the optimum manner. In the most generalised form, therefore, the distance sensors can move along three independent spatial directions relative to the substrate holder.

In a further embodiment, additional sensors, in particular infrared sensors, to the outer and inner distance sensors are used in order to achieve an extension of WO2012028166A1 with the inventive idea. It would then be possible to carry out the inventive idea of the wedge error compensation in addition to an in-situ measurement of the wedge error according to WO2012028166A1.

From the technical standpoint, 3 distance sensor pairs are best provided, preferably more than 3, still more preferably more than 5, most preferably more than 10, with utmost preference more than 15. From the economic standpoint, the number of the distance sensor pairs is however preferably as small as possible, since the distance sensors are relatively expensive. Since the task to be performed can be solved exactly in mathematical terms using three distance sensor pairs, the use of precisely three distance sensor pairs is economically preferable and technically sufficient.

The substrate holders comprise fixings. The fixings serve to secure the substrates. The fixings can be
1. mechanical fixings, in particular
    1.1, clamps
2. vacuum fixings, in particular with
    2.1. individually controllable vacuum tracks
    2.2. vacuum tracks connected to one another
3. electrical fixings, in particular
    3.1. electrostatic fixings
4. magnetic fixings
5. adhesive fixings, in particular
6. Gel-Pak fixings
7. fixings with adhesive, in particular controllable surfaces.

The fixings are in particular electronically controllable. The vacuum fixing is the preferred type of fixing. The vacuum fixing preferably comprises a plurality of vacuum tracks, which emerge at the surface of the substrate holder. The vacuum tracks are preferably individually controllable. In a technically more feasible application, several vacuum tracks are united to form vacuum track segments, which are individually controllable, and can therefore be evacuated or flooded individually. Each vacuum segment is however independent of the other vacuum segments. The possibility of constituting individually controllable vacuum segments is thus obtained. The vacuum segments are preferably designed annular or in the shape of a circle segment. A targeted, radially symmetrical fixing and/or release of a substrate from the sample holder, which in particular is performed from the inside outwards, is thus enabled.

According to the invention, substrate surfaces and/or substrate holder surfaces are preferred which have the least possible roughness. The roughness is indicated either as an average roughness, quadratic roughness or as an averaged roughness depth. The determined values for the average roughness, the quadratic roughness and the averaged roughness depth generally differ for the same measurement section or measurement area, but lie in the same range in terms of order of magnitude. Thus, the following numerical value ranges for the roughness are therefore to be understood either as values for the average roughness, the quadratic roughness or for the averaged roughness depth. The roughness of the substrate surface and/or the substrate holder surface is less than 100 μm, preferably less than 10 μm, still more preferably less than 1 μm, most preferably less than 100 nm, with utmost preference less than 10 nm.

According to the invention, the waviness should also be as low as possible. Waviness is understood to mean the deviation in shape of the second-order from the required surface quality.

In an embodiment according to the invention, the substrate holders are designed such that they themselves can be deformed in order also to deform the substrate by the deformation.

Device

The device includes at least one substrate holder. The substrate holder is preferably located at the upper side of the device.

The device, in particular a lower substrate holder, can comprise loading pins in order to load the lower substrate in the optimum manner.

The device can comprise alignment elements, so as to be able to align the substrates with one another in the lateral direction, i.e, in the x- and y-direction. In the simplest embodiment, it involves mechanical alignment elements such as for example pins against which the substrates strike and are thus positioned in their lateral displacement.

Purely mechanical alignment elements such as pins are used for example in temporary bonding, wherein a submicrometre-precise alignment of the substrates with one another is not required.

In a preferred embodiment, it involves in particular mobile slides, with the aid of which a substrate can be displaced laterally and brought into position.

In another embodiment, the device comprises optical alignment means, with the aid of which characteristic features on the substrates, in particular alignment marks, can be detected. The alignment marks are then brought into congruence with one another by a relative translation or aligned with one another in an alignment process. It may be necessary to combine the wedge error compensation according to the invention with the relative translatory displacement of the substrates, in order to get the alignment marks correctly into the depth of field range of the alignment optics. A further possibility for the alignment includes aligning only the substrate edges with one another with the aid of optics.

An optical alignment is mainly required when the substrates are wafers, which are to be bonded to one another in the course of a fusion bonding process. Furthermore, an optical alignment is advantageous when at least one of the two substrates is an embossing stamp, which is intended to emboss an embossing pattern in an embossing material on a second substrate. In this case, alignment marks are preferably used to ensure correct positioning and alignment of the substrates with one another.

In a very special embodiment according to the invention, the inner distance sensors are part of the first substrate holder and the outer distance sensors are part of the second substrate holder.

Calibration Process

A calibration process is first described, which in particular must be carried out once in order to then be able to correct the wedge error between the substrate pairs.

In a first calibration process step, a first substrate is loaded and fixed on a first, in particular upper, substrate holder according to the invention. The fixing must take place in such a way that all the inner distance sensors of the substrate holder according to the invention can measure the distance to the rear side of the first substrate. The zero point is set for the distance sensors in this calibration process step. The setting of the zero point is understood to mean that the inner distance sensors must obtain a measured value of zero in a measurement carried out in this process step. Since it involves distance sensors, the measured value is to be equated with a distance value. If the measured value deviates from zero, this measured value must be duly stored by software and/or hardware and be deducted as an offset in further measurements. A measured value of zero indicates that the fixed substrate surface of the upper fixed substrate is identical to the substrate holder surface which is fixing the substrate.

In a second calibration process step, a second, lower substrate is loaded onto a second substrate holder. The second substrate holder does not necessarily have to be constituted like the first substrate holder. For the sake of simplicity, a standard substrate holder without the distance sensor pairs is described.

It would of course also be conceivable for the lower substrate to be loaded first and then the upper substrate. The sequence of the first two calibration process steps is therefore interchangeable.

In a third calibration process step, a relative translatory approach of the substrate holders towards one another can take place. Before this approach step, the substrate holders are relatively distant from one another and are first brought closer together in particular in the third step. In particular an, in particular rough, alignment of the substrates with one another in the x- and y-direction can already take place in the third calibration process step. Since the wedge error has not yet been corrected at this point in time, it can only be a rough alignment. The wedge error compensation would of course generally ruin a fine adjustment. The smallest distance between the substrate surfaces facing one another is less than 5 mm, preferably less than 1 mm, still more preferably less than 0.1 mm, most preferably less than 0.01 mm, with utmost preference less than 0.001 mm.

In a fourth calibration process step, the upper substrate is dropped or loaded onto the lower substrate.

In a fifth calibration process step, the inner distance sensors measure the distances to the rear side of the dropped substrate. These distances are generally different.

In a sixth calibration process step, the wedge error between the substrate surface of the upper substrate and the substrate holder surface of the upper substrate holder can be compensated. For this purpose, the substrate holders are tilted with respect to one another, in such a way that the measured distances of inner distance sensors are the same. Since a zero setting of the inner distance sensors took place in the first calibration process step, it is ensured that the measured distances of all the distance sensors relate to the distance between the upper substrate holder surface and the rear side of the upper substrate.

In a seventh calibration process step, the distances to the substrate holder surface of the lower substrate are then measured with the aid of the outer distance sensors. These distances are stored and can be used in the case of a further loaded substrate pair in order to immediately compensate for the wedge error between the two substrates, without the upper substrate having to be dropped again. A pre-requisite is of course that all the loaded substrates must have the same thickness profile, preferably a homogeneous thickness. Thus, they do not have to have the same thickness, but the thickness must be constant as a function of the location. If the thickness changes as a function of the location, it must also be ensured that the substrates that are used in the subsequent process have the same orientation with respect to the substrate holders as the substrates that had been used for the calibration process.

On account of gravitation, it is of course expedient to use the substrate holder with the distance sensor pairs at the upper side and to drop an upper, fixed substrate in the fourth calibration process step. It is however clear to the person skilled in the art that the substrate holder with the distance sensor pairs could also be provided at the lower side. If the substrates have, for example, such a good adhesion between their substrate surfaces, as is the case for example with polished silicon wafers, it would also be conceivable for the fourth calibration process step of dropping to be replaced by pulling up the lower substrate onto the upper substrate. This pulling-up would take place by means of a spontaneous prebond as soon as the two substrates make contact at at least one point and a bonding wave is propagated, which pulls the lower substrate upwards, which in this case must not of course be fixed by the lower substrate holder.

Wedge Error Compensation Process

After the calibration has been carried out, the wedge error between two substrates can now be corrected.

In a first process step, a first, upper substrate is loaded and fixed on a first, upper substrate holder with the distance sensor pairs.

In a second process step, a second, lower substrate is loaded onto a second substrate holder. The second substrate holder does not necessarily have to be a substrate holder with distance sensor pairs. For the sake of simplicity, a standard substrate holder is described.

It would of course also be conceivable for the lower substrate to be loaded first and then the upper substrate. The sequence of the first two process steps is therefore interchangeable.

In a third process step, a relative translatory approach of the substrate holders towards one another can take place. In particular, a preferably rough and/or fine alignment of the substrates with respect to one another in the x- and y-direction can already take place in the third process step. It does however need to be borne in mind that, in the case of a wedge error still present, the fine alignment can be ruined again by the subsequent compensation of the wedge error and at all events has to be carried out again in a subsequent process step. Nonetheless, the subsequent result can be favourable due to a fine alignment in this process step.

In a fourth process step, the stored distances or the distances between the two substrate holders multiplied by a real number, an x factor, are adjusted at the respective positions of the individual outer distance sensors. The wedge error between the substrates is thus automatically eliminated.

After the fourth process step, the process itself is completed. Still further process steps will of course follow. These further process steps, however, are no longer part of the idea and are therefore only mentioned superficially.

Some of the stated process steps of the calibration and/or wedge error compensation process can be carried out simultaneously.

A fine alignment of the substrates with respect to one another is conceivable. Since the wedge error between the substrates has been removed, a fine adjustment can align the substrates in the horizontal plane very precisely with respect to one another. In particular, the substrates are aligned with one another with the aid of alignment marks.

A further uniform approach of the two substrates in order to bring the substrates still closer together is also conceivable.

Curving of the upper substrate by means of a concentrically positioned curving means, in particular a pin, is also conceivable. This kind of contacting takes place in particular in fusion bonding.

A photolithographic treatment of a photosensitive layer on the lower substrate is also conceivable if the upper substrate is a photomask.

An embossing step of an embossing material on the lower substrate is also conceivable, if the upper substrate is a stamp, in particular a soft stamp.

The process of the wedge error compensation is not therefore directed towards a special technical method, but can be used anywhere where it is a matter of aligning two surfaces plane-parallel, i.e. without wedge errors, with respect to one another.

BRIEF DESCRIPTION OF THE DRAWINGS

Further advantages, features and details of the invention emerge from the following description of preferred examples of embodiment and with the aid of the drawings. In the figures:

FIG. 4c shows a third process step of a wedge error compensation, and FIG. 4d shows a fourth process step of a wedge error compensation.

Identical components or components with the same function are denoted by the same reference numbers in the figures.

DETAILED DESCRIPTION OF THE INVENTION

Figure 1:
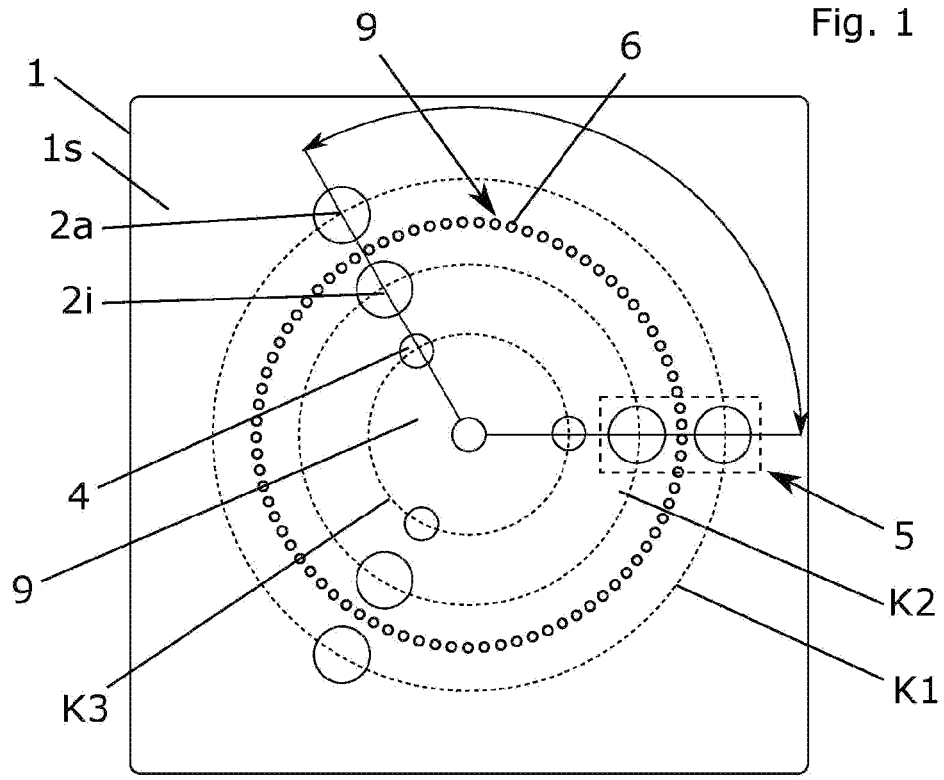
FIG. 1 shows a diagrammatic plan view of a first substrate holder according to the invention.

FIG. 1 shows a diagrammatic plan view of a substrate holder 1. Substrate holder surface 1s can be seen, on which a substrate (not shown) can be fixed. The fixing takes place by means of any fixing elements 9. Fixing elements 9 can for example be simple vacuum fixings, in particular holes 6. Three outer distance sensors 2a at an angular distance of 120° can be seen along a first circle K1. Three inner distance sensors 2i at an angular distance of 120° can be seen along a second circle K2. In each case, an inner distance sensor 2i and an outer distance sensor 2a form a distance sensor pair 5. Further optional sensors or optics 4 can also be seen, in particular along a third circle K3. Sensors or optics 4 can for example be infrared optics, with the aid of which an image of the surface or of the interface between two substrates 3o, 3u (not shown) can be made. Optics 4 are therefore only additional sensors which have nothing to do with the actual inventive idea.

It is however conceivable for the wedge error between two substrates to be measured directly with the aid of sensors 4, insofar as at least a substrate (not shown) fixed on substrate holder 1 is transparent for sensors 4. The measurement principle is then preferably based on an interference measurement, with the aid of which the distance between the two substrates (not shown) is measured directly. This measuring principle can also be carried out in addition to the measurement principle.

Figure 2:
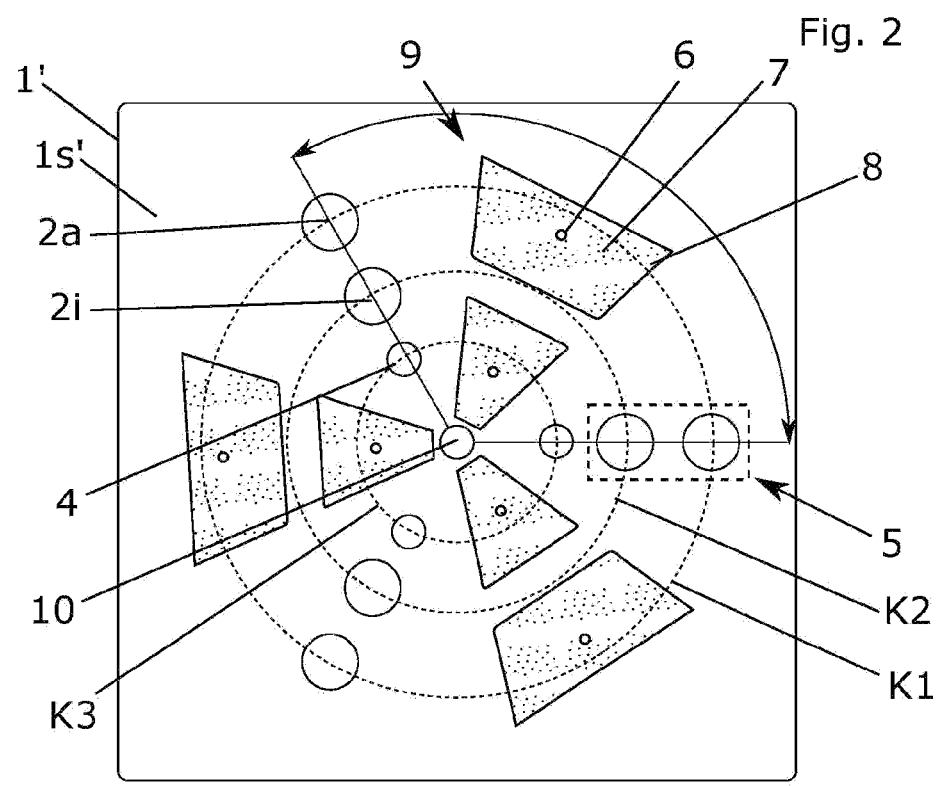
FIG. 2 shows a diagrammatic plan view of a second substrate holder according to the invention.

FIG. 2 shows a diagrammatic plan view of a substrate holder 1'. Substrate holder surface 1s' can be seen, on which a substrate (not shown) can be fixed. The fixing takes place by means of special fixing elements 9. Fixing elements 9 comprise recesses 7, which have been milled into substrate holder 1', in particular by a milling process. The recesses 7 are not however milled out over the entire surface, but comprise in the interior studs 8, which serve as a support for the substrate (not shown) fixed on substrate surface 1s'. Vacuum openings 6 are then present inside recess 7, via which recess 7 can be evacuated.

In particular, each fixing element 9 can be switched individually. Such an embodiment of fixing elements 9, which can be switched and grouped in different zones, are already known from publication WO 2017162272A1. Three outer distance sensors 2a at an angular distance of 120° can be seen along the first circle K1. Three inner distance sensors 2i at an angular distance of 120° can be seen along the second circle K2. In each case, an inner distance sensor 2i and an outer distance sensor 2a form a distance sensor pair 5. In addition, further optional sensors or optics 4 can also be seen, in particular along a third circle K3. Sensors or optics 4 can for example be infrared optics, with the aid of which an image of the surface or of the interface between two substrates 3o, 3u (not shown) can be made.

It is clear to the person skilled in the art that the kind of fixing elements 9 does not influence the idea and that the person skilled in the art can select from a multiplicity of fixing elements.

Substrate holders 1, 1' comprise, in particular in the centre, a deformation element 10. Deformation element 10 is in particular a passage, in particular a drill hole, through which a pin (not shown) can curve a fixed wafer. Deformation element 10 can also be designed as a nozzle or passage, through which a fluid passes to the rear side of a substrate (not shown) and deforms the latter by an increase in pressure. The curvature of the substrate (not shown) is not however an essential component of the invention and will not be dealt with in greater detail here.

The following descriptions of the figures represent the calibration process and the wedge error compensation process by schematic diagrams in cross-section. Each figure includes two representations.

The left-hand representation of each figure shows a full side view, reduced to the absolute minimum, of substrate holders 1u, 1o and substrates 3u, 3o. Substrates 3u, 3o and substrate holders 1u, 1o have been represented intentionally asymmetrically and markedly tilted, so that the method can be followed more easily. It is clear to the person skilled in the art that, in particular, the substrate holder surfaces of the front and rear side are produced plane-parallel with one another with extremely small tolerances. The same applies to the substrate surfaces. It is clear to the person skilled in the art that the rotational deviations between substrate holders 1u, 1o and/or substrates 3u, 3o amount to only a few degrees, if not even a few tenths.

The right-hand representation of each figure shows a reduced cross-sectional side view of substrate holders 1u, 1o and substrates 3u, 3o related to a single alignment pair 5. In contrast with the left-hand representation, the front and rear side of substrate holders 1u, 1o are constituted plane-parallel with one another. The same applies to substrates 3u, 3o. Furthermore, the rotational deviations between substrate holders 1u, 1o and/or substrates 3u, 3o are represented many times smaller.

The right-hand representation of a figure is used to clearly illustrate a process step. The left-hand representation of each figure permits a rapid recognition of the orientation situation of individual surfaces.

Figure 3A:
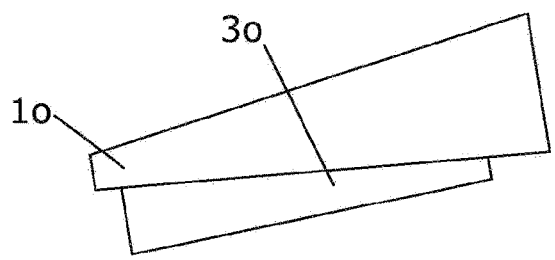
FIG. 3a shows a first process step of a calibration process.
Figure 3A:
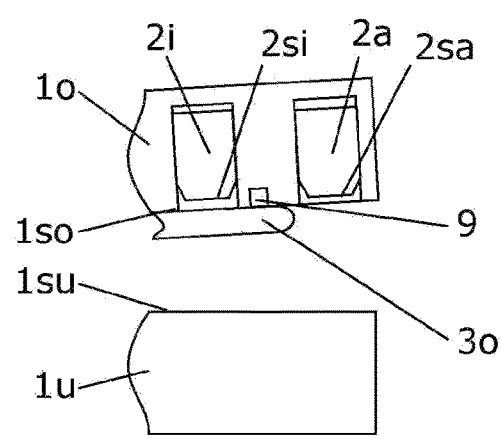

FIG. 3a shows a detail of a device in a first calibration process step, wherein an upper substrate 3o is loaded and fixed on upper substrate holder 1o according to the invention. In particular, the setting of the zero point for inner distance sensors 2i takes place in this calibration process step.

Figure 3B:
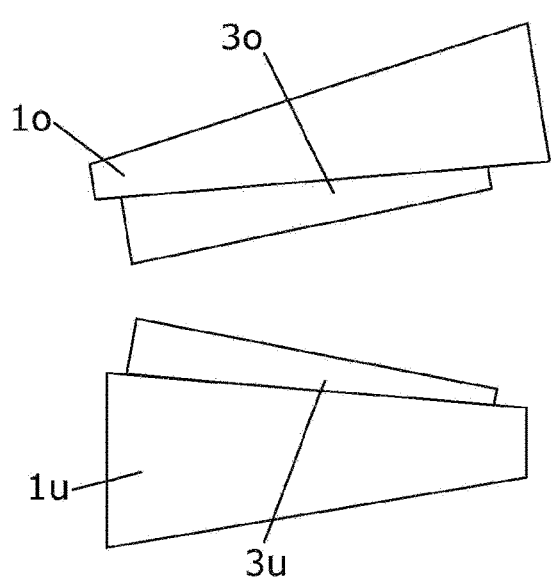
FIG. 3b shows a second process step of a calibration process.
Figure 3B:
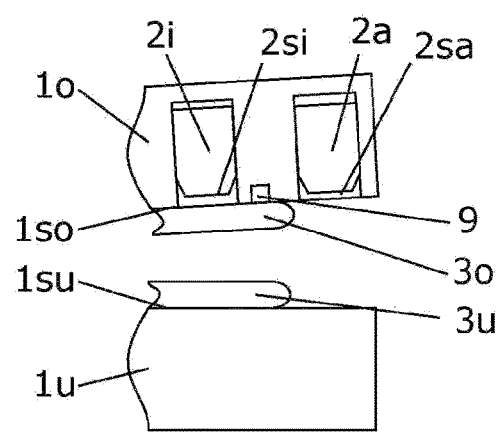

FIG. 3b shows a detail of a device in a second calibration process step, wherein a lower substrate 3u is loaded and fixed on lower substrate holder 1o.

Figure 3C:
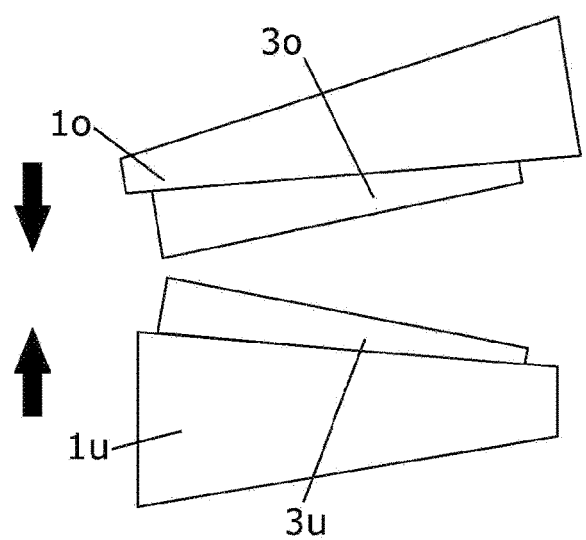
FIG. 3c shows a third process step of a calibration process.
Figure 3C:
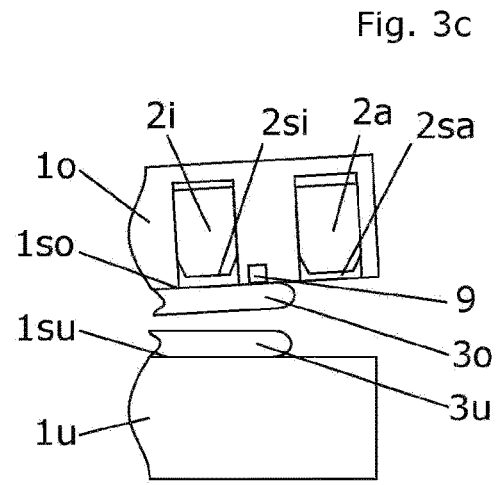

FIG. 3c shows a detail of a device in a third calibration process step, wherein an approach of the two substrates 3u and 3o takes place, whereby substrate holders 1o, 1u are moved relatively towards one another. An, in particular rough, alignment of the two substrates 3u and 3o in the lateral direction can occur in this process step.

It can be seen in all the figures that distance sensor surfaces 2si, 2sa do not lie inside the same plane. According to the invention, this is not relevant either, since the zero point of inner distance sensor 2i is set at a point in time at which upper substrate 3o is still fixed to upper substrate holder 1o. In particular, the setting of the zero point already takes place in the first calibration process step according to the invention, but at the latest at a point in time before the release of the upper substrate. It would also be conceivable for distance sensor surfaces 2si, 2sa to lie inside the same plane, but distance sensors 2a, 2i can never be positioned so exactly.

Figure 3D:
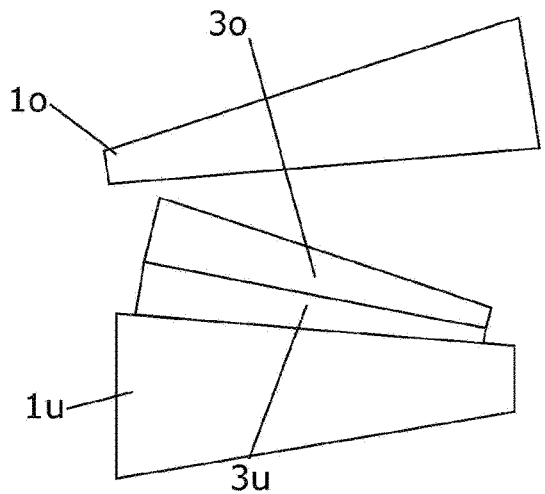
FIG. 3d shows a fourth process step of a calibration process.
Figure 3D:
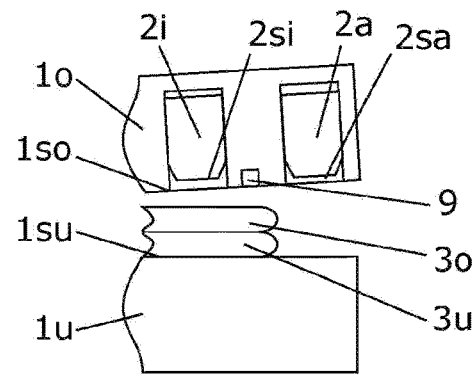

FIG. 3d shows a detail of a device in a fourth calibration process step, wherein upper substrate 3o is loaded onto lower substrate 3u or is preferably dropped onto lower substrate 3u.

Figure 3E:
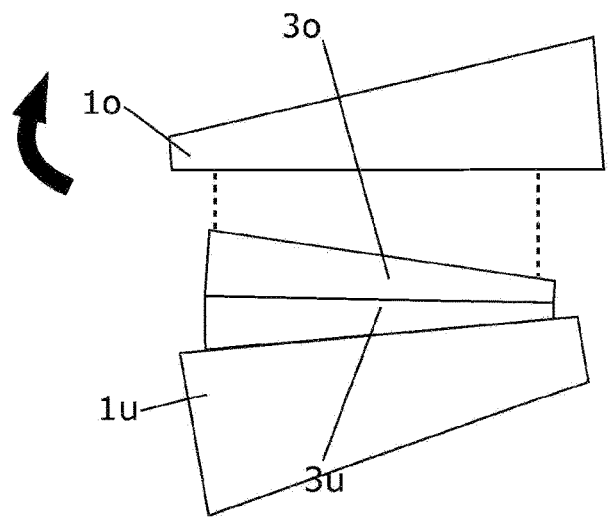
FIG. 3e shows a fifth process step of a calibration process.
Figure 3E:
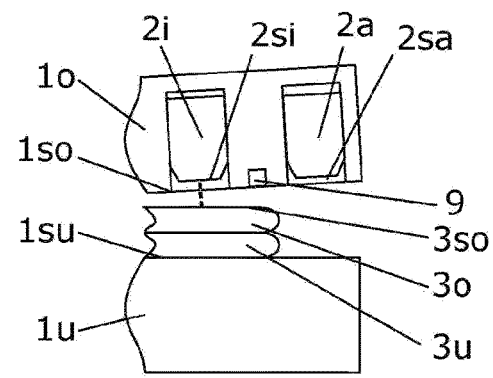

FIG. 3e shows a detail of a device in a fifth calibration process step, in which inner distance sensors 2i measure the distance to substrate surface 3so of upper substrate 3o. An essential aspect includes that the distances measured by inner distance sensors 2i do not represent the distance between inner distance sensor surface 2si and substrate surface 3so, but the distance between substrate holder surface 1so and substrate surface 3so. This step is exclusively part of the calibration and is no longer carried out during the wedge error compensation between further substrate pairs.

Figure 3F:
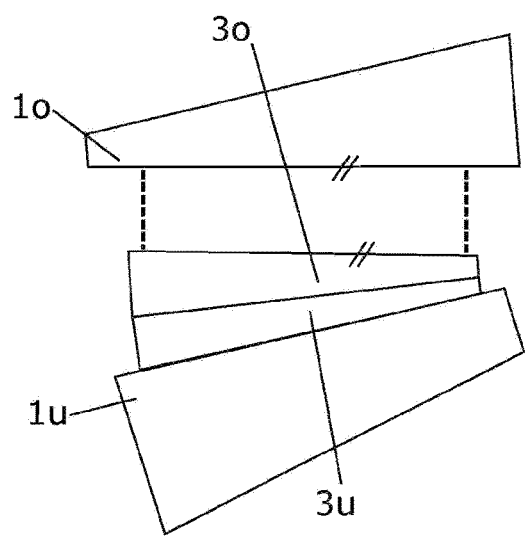
FIG. 3f shows a sixth process step of a calibration process.
Figure 3F:
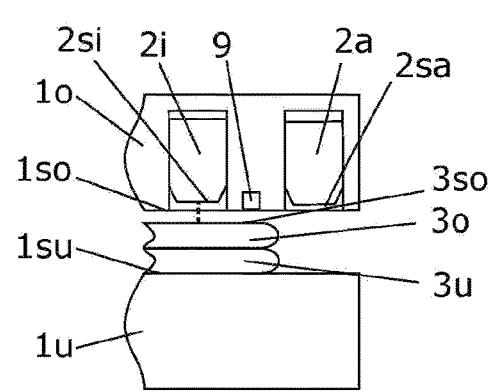

FIG. 3f shows a detail of a device in a sixth calibration process step, wherein the wedge error between upper substrate holder surface 1so and substrate surface 3so of upper substrate 3o is compensated with the aid of the distance measurement of inner distance sensors 2i. This step is exclusively part of the calibration and is no longer carried out during the wedge error compensation between further substrate pairs.

Figure 3G:
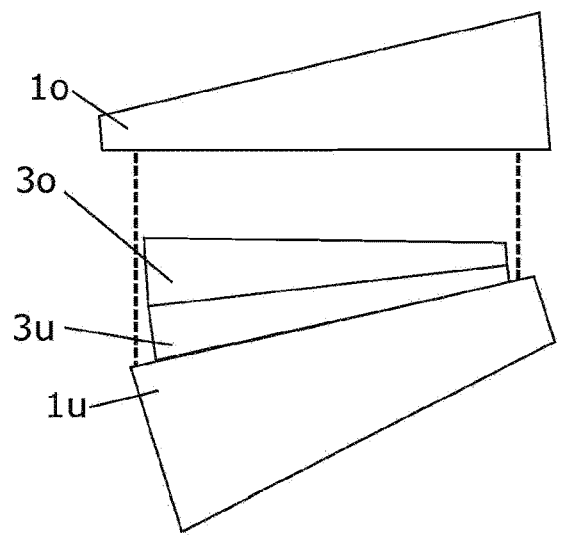
FIG. 3g shows a seventh process step of a calibration process.
Figure 3G:
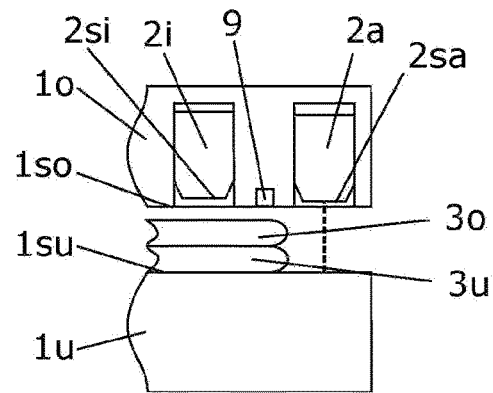

FIG. 3g shows a detail of a device in a seventh calibration process step, wherein outer distance sensors 2a measure the distances to substrate holder surface 1su of lower substrate holder 1u. These distances are stored.

The represented process in FIGS. 3a to 3g represents a calibration process. The distances of outer distance sensors 2a obtained by the calibration process can be used in order to compensate for the wedge error between further substrate pairs.

Figure 4A:
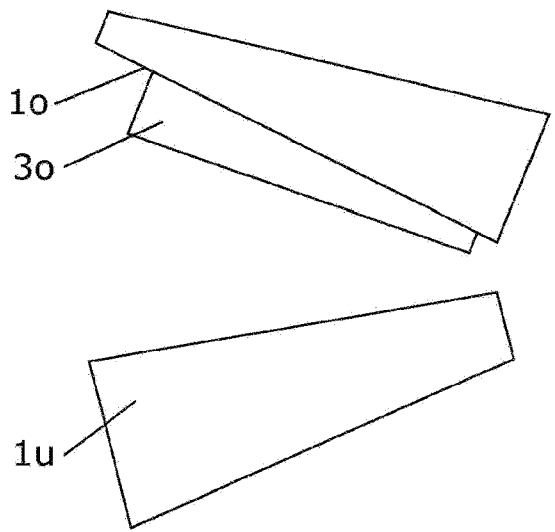
FIG. 4a shows a first process step of a wedge error compensation.
Figure 4A:
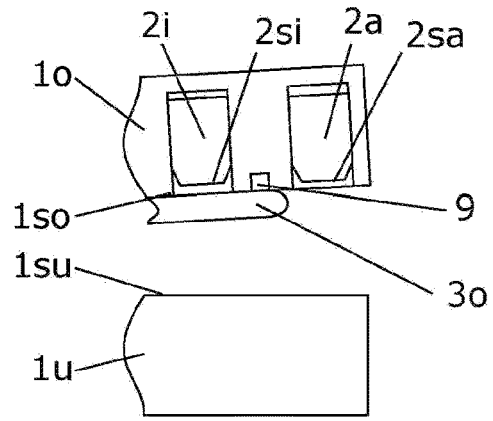

FIG. 4a shows a detail of a device in a first process step, wherein an upper substrate 3o is loaded and fixed on upper substrate holder 1o according to the invention.

Figure 4B:
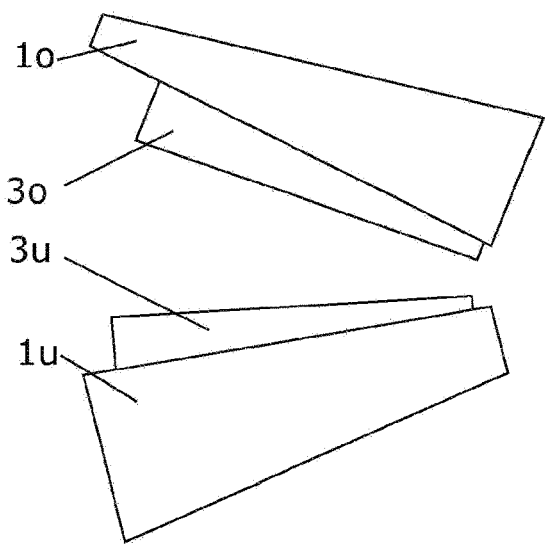
FIG. 4b shows a second process step of a wedge error compensation.
Figure 4B:
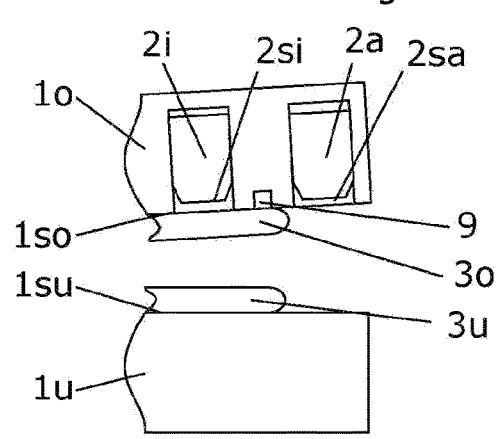

FIG. 4b shows a detail of a device in a second process step, wherein a lower substrate 3u is loaded and fixed on lower substrate holder 1o.

FIG. 4c shows a detail of a device in a third process step, wherein an approach of the two substrates 3u and 3o takes place, whereby substrate holders 1o, 1u are moved relatively towards one another. An, in particular rough, alignment of the two substrates 3u and 3o in the lateral direction can occur in this process step.

FIG. 4d shows a detail of a device in a fourth process step, wherein the two substrate holders 1u, 1o are adapted to one another, until such time as the distances of the outer distance sensors and the distances multiplied by a real number, an x factor, have been reached, said distances having been stored in compensation process step seven. In this state, the wedge error between substrates 3u, 3o has then been compensated.

LIST OF REFERENCE NUMBERS 1, 1o, 1u, 1' Substrate holder
1s, 1so, 1su, Substrate holder surface
1s'
2i, 2a Distance sensor
2si, 2sa Distance sensor surface
3o, 3u Substrate
3so Substrate surface
4 Sensors or optics
5 Distance sensor pair
6 Vacuum opening
7 Recesses
8 Studs
9 Fixing element
10 Deformation element
K1, K2, K3 Circle

What is claimed is:

1. A device for the alignment of substrates, comprising:
a first substrate holder for accommodating a first substrate on a first substrate holder surface,
a second substrate holder for accommodating a second substrate on a second substrate holder surface,
wherein the first substrate holder surface is facing towards the second substrate holder surface,
wherein the first substrate holder comprises at least three inner distance sensors for measuring first distances, the first distances being between the at least three inner distance sensors and the first substrate, and
wherein the first substrate holder comprises at least three outer distance sensors for measuring second distances, the second distances being between the at least three outer distance sensors and the second substrate holder surface of the second substrate holder.

2. The device according to claim 1, wherein in each case one of the at least three inner distance sensors and in each case one of the at least three outer distance sensors together form a distance sensor pair,
wherein preferably the respective inner distance sensor and the respective outer distance sensor of the distance sensor pair, proceeding from a reference point of the first substrate holder surface, are aligned in a radial direction.

3. The device according to claim 2, wherein the first substrate holder comprises at least three of the distance sensor pairs,
wherein respective one of the inner distance sensors and respective ones of the outer distance sensors of the at least three distance sensor pairs are in each case aligned in the radial direction.

4. The device according to claim 1, wherein the at least three outer distance sensors are arranged on a first circle about a reference point of the first substrate holder surface.

5. The device according to claim 4, wherein the at least three inner distance sensors are arranged on a second circle about the reference point of the first substrate holder surface, wherein the first circle and the second circle are concentric with respect to one another.

6. The device according to claim 1, wherein the at least three inner distance sensors and/or the at least three outer distance sensors are arranged beneath the first substrate holder surface.

7. The device according to claim 1, wherein the first substrate holder surface and the second substrate holder surface are able to be arranged at least partially above one another, so that the first substrate can be dropped onto the second substrate.

8. The device according to claim 1, wherein the at least three inner distance sensors and/or the at least three outer distance sensors are movable in a radial direction with respect to a reference point of the first substrate holder surface.

9. The device according to claim 5, wherein the at least three inner distance sensors are movable along the second circle and/or the at least three outer distance sensors along the first circle.

10. The device according to claim 1, wherein the at least three inner distance sensors and/or the at least three outer distance sensors are movable perpendicularly to the first substrate holder surface.

11. The device according to claim 1, wherein the first substrate holder and/or the second substrate holder are able to be aligned with one another so that a wedge error between the first substrate and the second substrate is able to be compensated.

12. The device according to claim 1, wherein the first substrate holder and/or the second substrate holder comprises controllable fixing elements, so that the first substrate and/or the second substrate can be fixed and/or released.

13. A method for aligning substrates, comprising:
accommodating a first substrate on a first substrate holder surface of a first substrate holder,
accommodating a second substrate on a second substrate holder surface of a second substrate holder, the first substrate holder surface facing towards the second substrate holder surface,
measuring first distances between at least three inner distance sensors of the first substrate holder and the first substrate, and
measuring second distances between at least three outer distance sensors of the first substrate holder and the second substrate holder surface of the second substrate holder.

14. The method according to claim 13, further comprising:
storing the first distances in an electronic data-processing device,
transferring the first substrate to the second substrate holder, such that the first substrate lies on the second substrate,
measuring further first distances between the at least three inner distance sensors and the first substrate, the first substrate lies on the second substrate, aligning the first substrate holder and/or the second substrate holder, so that in each case a difference between the respective measured further first distances of the at least three inner distance sensors and the respective stored first distances of the at least three inner distance sensors is the same, as a result of which a wedge error between the first substrate and the first substrate holder is compensated, storing the measured second distances in the electronic data-processing device, wherein the storing of the measured second distances takes place after the aligning of the first substrate holder and/or the second substrate holder.

15. The method according to claim 14, further comprising:

aligning a further first substrate and a further second substrate with one another, the aligning depending on the stored second distances, so that a wedge error between the further first substrate and the further second substrate is compensated.

16. The device according to claim 1, wherein the first distances are between the at least three inner distance sensors and a substrate surface of the first substrate.

17. The device according to claim 2, wherein the reference point is a centre point of the first substrate holder surface.

18. The device according to claim 4, wherein the at least three outer distance sensors are arranged symmetrically offset on the first circle.

19. The device according to claim 5, wherein the at least three inner distance sensors are arranged symmetrically offset on the second circle.

20. The device according to claim 1, wherein alignment of the first substrate holder and/or the second substrate holder with one another is dependent on the first distances and/or the second distances.

* * * * *